(12) United States Patent
Mizutani

(10) Patent No.: US 6,277,734 B1
(45) Date of Patent: Aug. 21, 2001

(54) SEMICONDUCTOR DEVICE FABRICATION METHOD

(75) Inventor: Takahiko Mizutani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/321,617

(22) Filed: May 28, 1999

(30) Foreign Application Priority Data

Aug. 28, 1998 (JP) .................................................. 10-243950

(51) Int. Cl.⁷ ................................................ H01L 21/4763
(52) U.S. Cl. ............................ 438/637; 438/257; 438/264
(58) Field of Search .................................... 438/257–267, 438/637–641, 672, 673, 674, 675; 257/383, 751

(56) References Cited

U.S. PATENT DOCUMENTS

| 5,841,195 | * | 11/1998 | Lin et al. ............................. | 438/637 |
| 5,847,463 | * | 12/1998 | Trivedi et al. ...................... | 257/751 |
| 5,920,098 | * | 7/1999 | Liaw ................................... | 257/383 |
| 6,037,223 | * | 3/2000 | Su et al. ............................. | 438/257 |

FOREIGN PATENT DOCUMENTS

| 4-29327 | 1/1992 | (JP) . |
| 4-359521 | 12/1992 | (JP) . |
| 5-13434 | 1/1993 | (JP) . |
| 6-61253 | 3/1994 | (JP) . |
| 6-196498 | 7/1994 | (JP) . |
| 6-196499 | 7/1994 | (JP) . |
| 6-260497 | 9/1994 | (JP) . |
| 8-162635 | 6/1996 | (JP) . |
| 8-264770 | 10/1996 | (JP) . |

* cited by examiner

*Primary Examiner*—David Nelms
*Assistant Examiner*—Dung A Le
(74) *Attorney, Agent, or Firm*—Armstrong, Westerman, Hattori, McLeland & Naughton, LLP

(57) ABSTRACT

A semiconductor device fabrication method comprises the steps of forming on a substrate 10 a plurality of lines 20 on upper surfaces and side surfaces of which a first insulation film is formed on; depositing a second insulation film 28 on and/or above the substrate 10 and the lines 20, filling gaps between one of the lines 20 and its adjacent one to thereby form the second insulation film 28; forming on the second insulation film 28 a third insulation film 30 having etching characteristics different from those of the second insulation film 28; etching the third insulation film 30 with the second insulation film 28 as a stopper; and etching the second insulation film 28 to a contact hole 32 which reaches the substrate 10.

11 Claims, 7 Drawing Sheets

SEMICONDUCTOR DEVICE FABRICATION METHOD

BACKGROUND OF THE INVENTION

The present invention relates to a semiconductor device fabrication method, more specifically a semiconductor device fabrication method which can micronize lines.

As LSI becomes larger-scaled, device micronization is pursued.

In order to realize semiconductor integrated circuits including gate electrodes, lines and contact holes of microdimensions it has been conventionally conducted that the lithography uses short exposure wavelengths for higher resolving ability.

While minimum development dimensions are thus diminished, various device structures which allow alignment margins for alignment between lithography steps have been studied so as to make dimensions of devices smaller without diminishing dimensions of patterns to be formed.

Self-aligned contact (hereinafter called SAC) is noted as a technique that can reduce dimensions of devices without diminishing dimensions of patterns to be formed.

In semiconductor device fabrication methods using SAC, when an inter-layer insulation film 130 is etched, as shown in FIG. 7A, a stopper film 128 functions as the etching stopper, and protects an insulation film 118 from excessive etching, whereby a gate electrode 120 can be prevented from exposure. Even if a disalignment takes place in a lithography step, a contact hole 132 can be formed at a preset position.

However, in the above-described semiconductor device fabrication method, as a pitch between gate electrodes 120 becomes smaller with more micronization of the semiconductor device, as shown in FIG. 7B a stopper film 128 unpreferably defines a small gap 129. As a result, when the inter-layer insulation film 130 is etched with the stopper film 128 as the etching stopper, sometimes that of the inter-layer insulation film 130 in the gap 129 cannot be completely removed.

In such case, in order to remove all the inter-layer insulation film 130 in the gap 129, overetching must be performed. However, the overetching often unpreferably etches not only the inter-layer insulation film 130 but also the stopper film 128 and the insulation film 118, and often unpreferably exposes even the gate electrodes 120 or etches even the silicon substrate 110. This often degrades reliability of the semiconductor device.

SUMMARY OF THE INVENTION

An object of the present invention is to provide a semiconductor device fabrication method which can micronize the semiconductor device without degrading reliability thereof.

The above-described object is achieved by a semiconductor device fabrication method comprising the steps of: forming on a substrate a plurality of lines on upper surfaces and side surfaces of which a first insulation film is formed on; depositing a second insulation film on and/or above the substrate and said lines, filling gaps between one of said lines and its adjacent one to thereby form the second insulation film; forming on the second insulation film a third insulation film having etching characteristics different from those of the second insulation film; etching the third insulation film with the second insulation film as a stopper; and etching the second insulation film to form a contact hole which reaches the substrate. The second insulation film is deposited substantially perpendicular to the substrate, whereby the surface of the second insulation film defines no narrow gap, and a required contact hole can be formed. A semiconductor device can be fabricated without degrading its reliability.

The above-described object is achieved by a semiconductor device fabrication method comprising the steps of: forming on a substrate a plurality of lines on upper surfaces and side surfaces of which a first insulation film is formed; forming a second insulation film on the substrate and said lines, filling gaps between one of said lines and its adjacent one; forming on the second insulation film a third insulation film having etching characteristics different from those of the second insulation film; etching the third insulation film with the second insulation film as a stopper, and further etching the second insulation film to form a contact hole which reaches the substrate; and forming a fourth insulation film in the contact hole. Even in a case that a large undercut is formed in the second insulation film, an insulation voltage resistance can be high between adjacent contact holes. Accordingly, a micronized semiconductor device can be fabricated without degrading its reliability.

DETAILED DESCRIPTION OF THE INVENTION

A First Embodiment

Figure 1A:
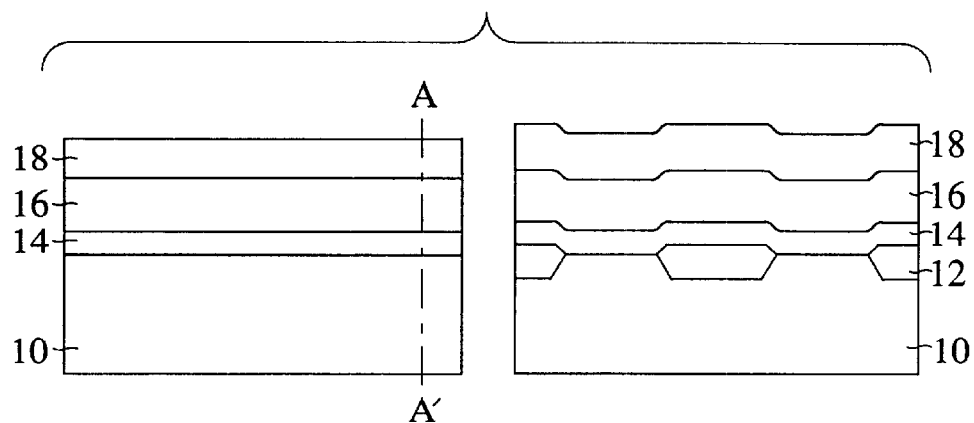
FIGS. 1A to 1C are sectional views (Part 1) of a semiconductor device in the steps of the semiconductor device fabrication method according to a first embodiment of the present invention.

The semiconductor device fabrication method according to a first embodiment of the present invention will be explained with reference to FIGS. 1A to 3B. FIGS. 1A to 3B are sectional views of a semiconductor device in the steps of the semiconductor device fabrication method according to a first embodiment of the present invention. The semiconductor device fabrication method according to the present embodiment is applied to a DRAM. In FIGS. 1A to 3B the left side of the drawing is a sectional view of the semiconductor device perpendicular to a direction of extension of word lines of the DRAM, and the right side of the drawing is a sectional view along the word lines of the DRAM, i.e., along the line A–A' which is perpendicular to the drawing on the left side.

First, a device isolation film 12 is formed on the surface of a silicon substrate 10 by LOCOS.

Then, a gate insulation film (not shown) is formed on the entire surface.

Next, a polysilicon film 14 of 50 nm-thickness is formed on the gate insulation film by CVD.

Then, a WSi film 16 of 120 nm-thickness is formed on the polysilicon film 14.

Next, an SiON film of 30 nm-thickness and a silicon oxide film of 50 nm-thickness are formed on the WSi film 16 by CVD to thereby form an insulation film 18 of the SiON film and the silicon oxide film (see FIG. 1A).

Figure 1B:
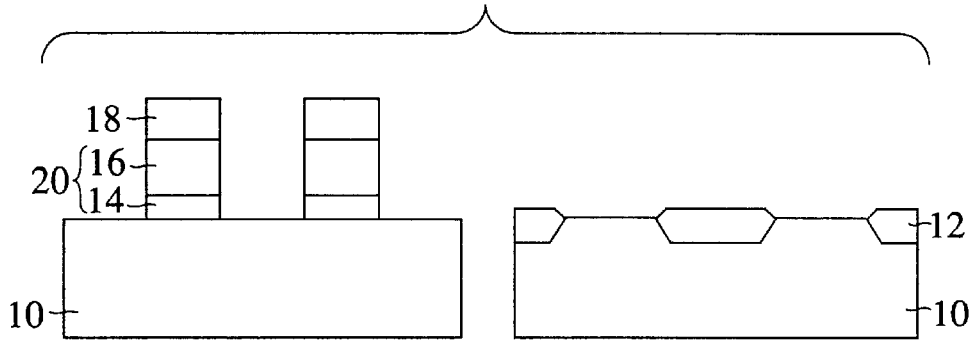

Then, the (first) insulation film 18, the WSi film 16 and the polysilicon film 14 are patterned by photolithography to form a gate electrode 20 of the polysilicon film 14 and the WSi film 16 (see FIG. 1B).

Figure 1C:
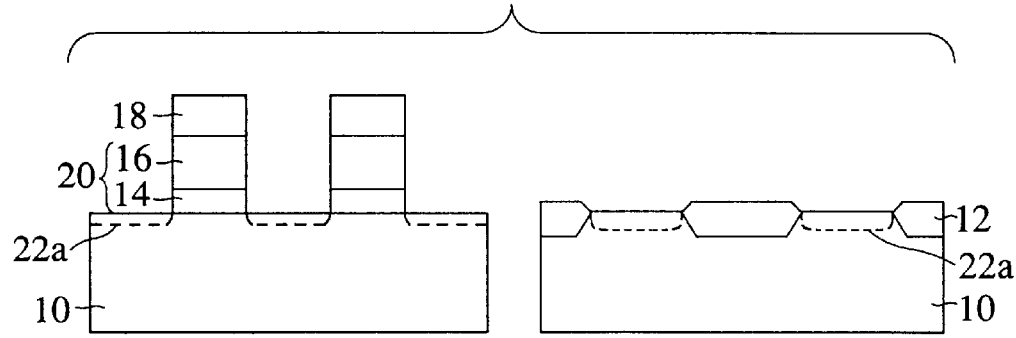
Figure 2A:
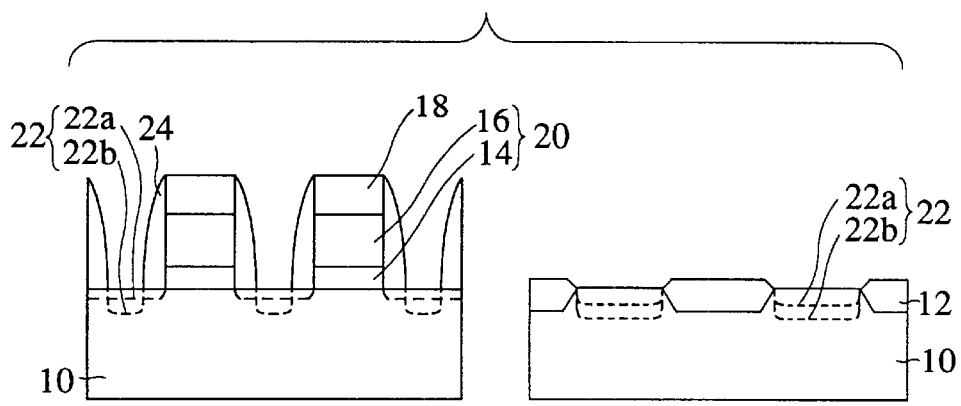
FIGS. 2A to 2C are sectional views (Part 2) of the semiconductor device in the steps of the semiconductor device fabrication method according to a first embodiment of the present invention.
Figure 2B:
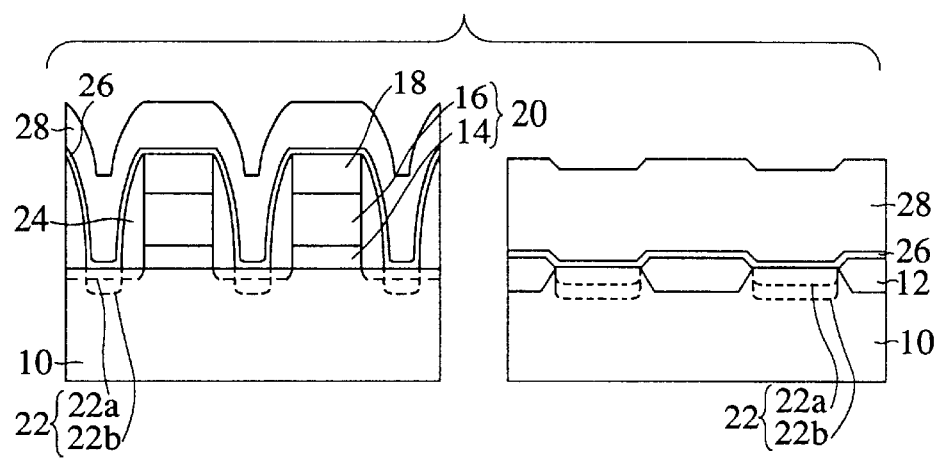
Figure 2C:
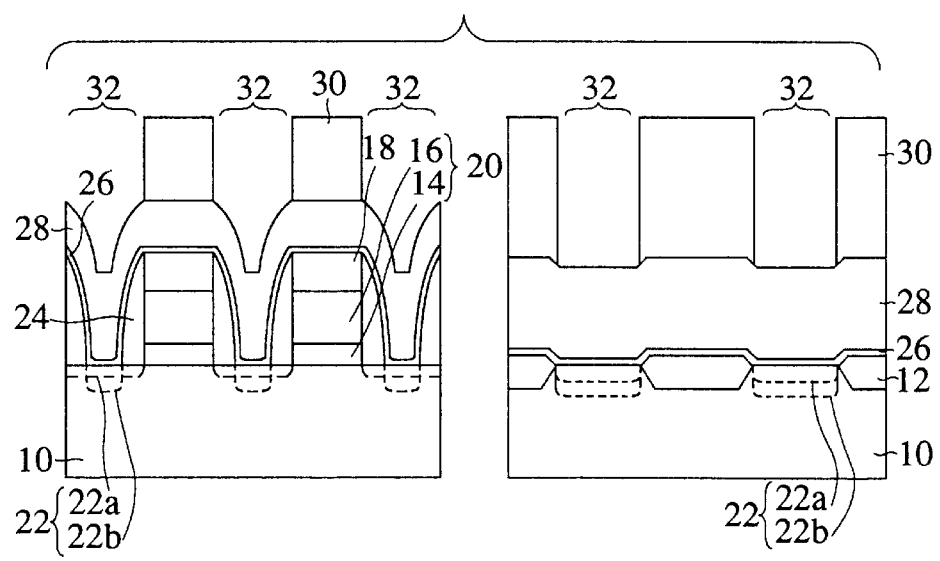
Figure 3A:
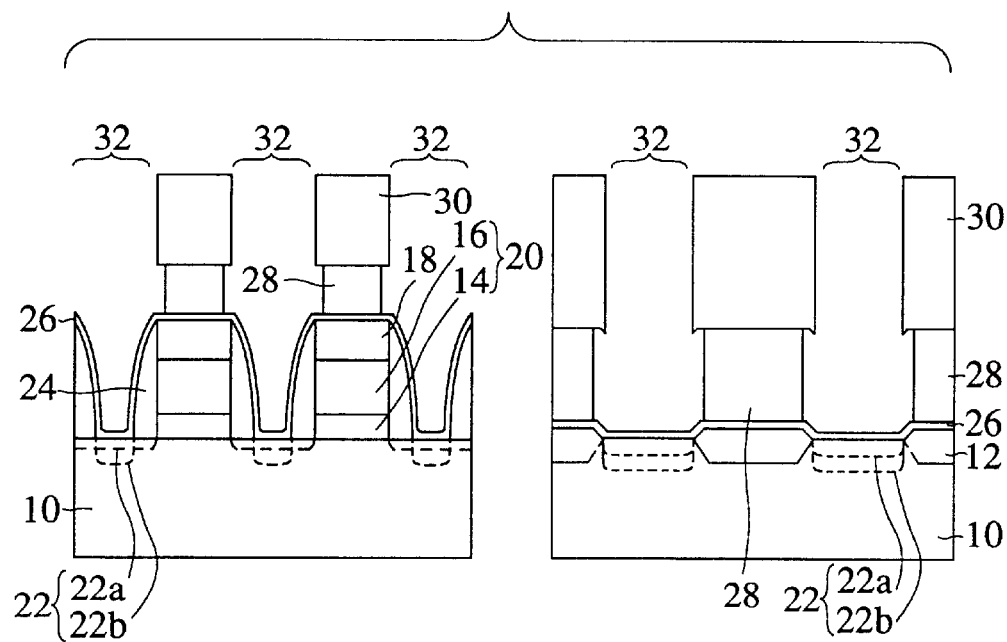
FIGS. 3A and 3B are sectional views (Part 3) of the semiconductor device in the steps of the semiconductor device fabrication method according to the first embodiment of the present invention.
Figure 3B:
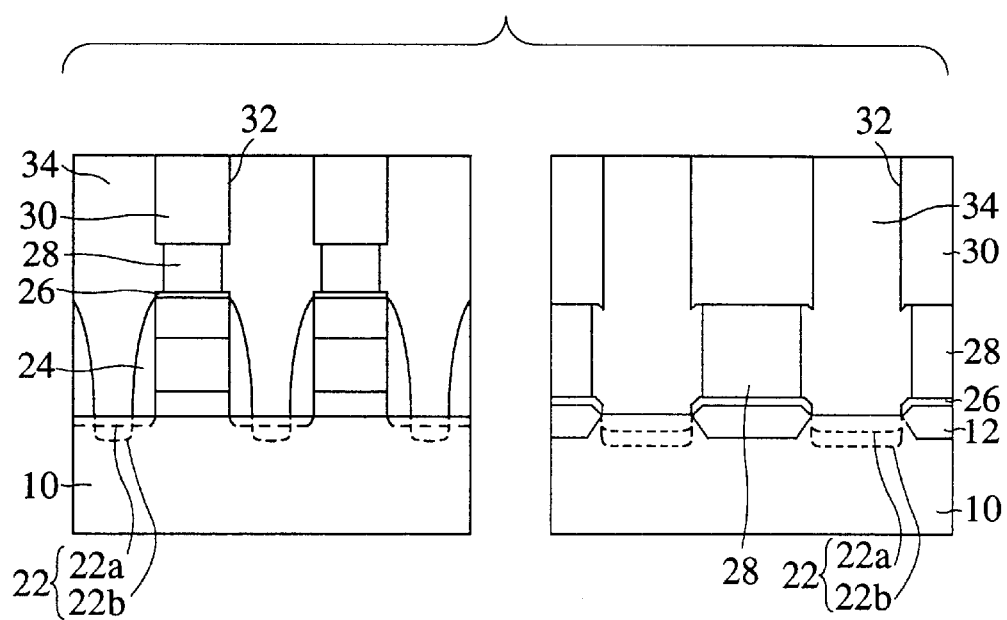
Figure 4A:
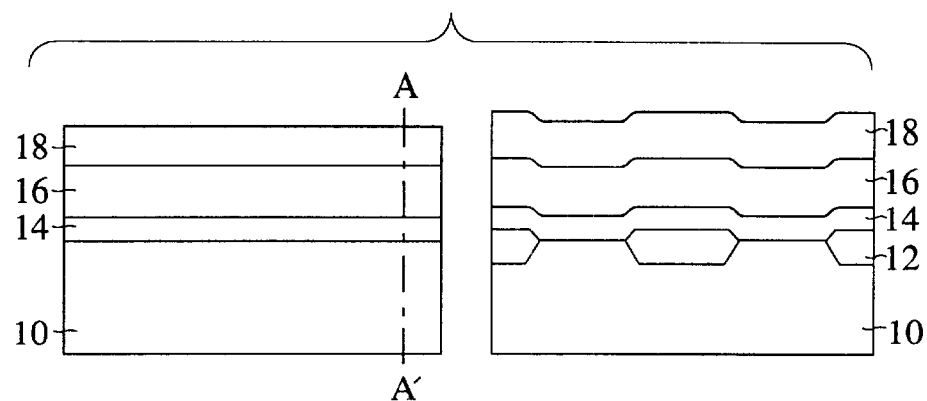
FIGS. 4A to 4C are sectional views (Part 1) of a semiconductor device in the steps of the semiconductor device fabrication method according to a second embodiment of the present invention.
Figure 4B:
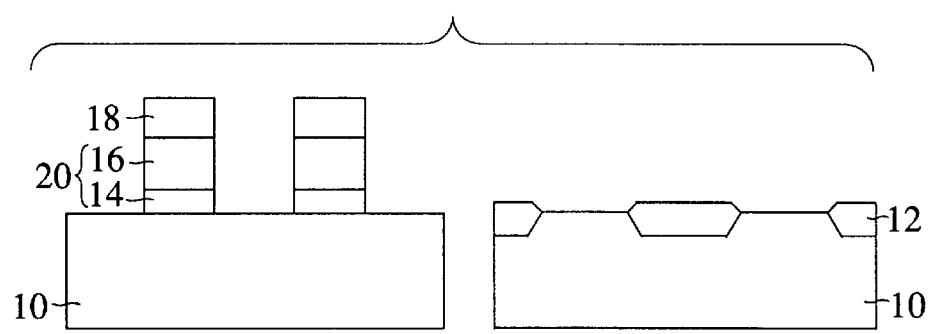
Figure 4C:
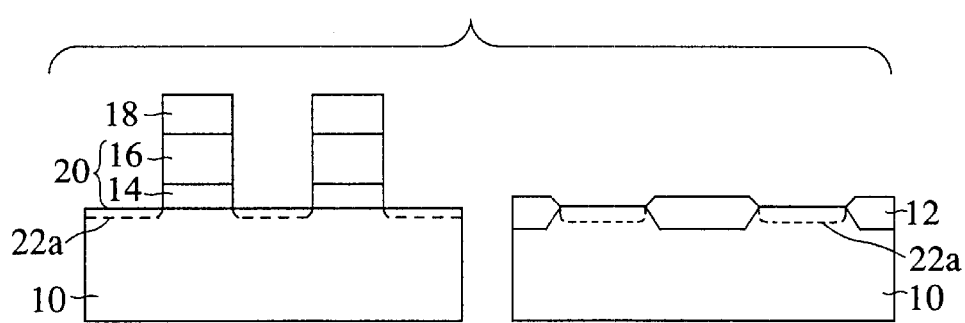

Then, a dopant is implanted by self-alignment with the gate electrode 20 to form a lightly doped diffusion layer 22$a$ (see FIG. 1C).

Next, a silicon oxide film of 70 nm-thickness is formed on the entire surface. The silicon oxide film is subjected to anisotropic etching to form a sidewall (first) insulation film 24 of the silicon oxide film on the sides of the gate electrode.

Then, a dopant is heavily implanted by self-alignment with the gate electrode 20 to form a heavily-doped diffusion layer 22$b$. The lightly-doped diffusion layer 22$a$ and the heavily-doped diffusion layer 22$b$ constitute a source/drain diffusion layer 22 (see FIG. 2A).

Next, a silicon oxide film 26 of 20 nm-thickness is formed on the entire surface. The silicon oxide film 26 functions as an etching stopper for etching the stopper (second insulation) film 28 in a later step.

Then, a negative bias is applied to the silicon substrate 10 to form a stopper film 28 of 100 nm-thickness on the entire surface by plasma CVD. The plasma CVD with the negative bias applied to the silicon substrate 10 deposits the stopper film 28 substantially perpendicularly to the silicon substrate 10. The stopper film, which has a film thickness as large as 100 nm, does not define a small gap on the surface of the stopper film 28 between the gate. electrodes 20. A film thickness of the stopper film 28 is suitably set so that the stopper film 28 defines no narrow gap between the gate electrodes 20 and can be, e.g., 100 nm to 200 nm (see FIG. 2B).

Next, an inter-layer (third) insulation film 30 of a 1 $\mu$m-film thickness PSG film is formed on the entire surface.

Then, the inter-layer insulation film 30 is etched with the stopper film 28 as an etching stopper film to form a contact hole 32 down to the surface of the stopper film 28. The etching is anisotropic, and the etching gas is, e.g., $C_4F_8/Ar/O_2/CO$ gas. Because of no narrow gap defined by the surface of the stopper film 28 between the gate electrodes 20, no residue of the inter-layer insulation film 30 resides on the stopper film 28, and the contact hole 32 can be formed down to the surface of the stopper film 28 (see FIG. 2C).

Then, the stopper film 28 is subjected to semi-anisotropic etching with the silicon oxide film 26 as an etching stopper. Here the anisotropic etching means etching which advances at an especially higher etching rate in one direction while advancing a little also perpendicularly to said one direction. The semi-anisotropic etching is used because it is difficult to etch the stopper film 28 by anisotropic etching at a high selection ratio with respect to the silicon oxide film 26. The semi-anisotropic etching can etch the stopper film 28 at a high selection ratio with respect to the silicon oxide (fifth insulating) film 26. An etching gas is, e.g., $SF_6/HBr/N_2$ gas, $SF_6/O_2/N_2$ gas or others. Thus, the stopper film 28 can be etched, forming no large undercut (see FIG. 3A).

Next, the silicon oxide film 26 is etched by anisotropic etching to form a contact hole 32 which reaches the source/drain diffusion layer 22.

Then, a polysilicon film is formed on the entire surface by CVD. Subsequently the polysilicon film is polished by CMP (Chemical Mechanical Polishing) until the surface of the inter-layer insulation film 30 is exposed to thereby form a conductor plug 34 of the polysilicon film in the contact hole (see FIG. 3B).

As described above, according to the present embodiment, the stopper film is formed thick by plasma CVD with a negative bias applied to the silicon substrate, whereby the surface of the stopper film defines no small gap, and accordingly a required contact hole which reaches the source/drain diffusion layer can be formed. As a result a micronized semiconductor device can be fabricated without degrading its reliability.

A Second Embodiment

The semiconductor device fabrication method according to a second embodiment will be explained with reference to FIGS. 4A to 6C. FIGS. 4A to 6C are sectional views of a semiconductor device in the steps of the semiconductor device fabrication method according to the present embodiment, which show the process. The same members of the present embodiment as those of the semiconductor device fabrication method according to the first embodiment are represented by the same reference numbers not to repeat their explanation or to simplify their explanation.

The semiconductor device fabrication method according to the present embodiment is characterized mainly in that a stopper film is formed by thermal CVD, and an insulation film is formed in the contact hole to thereby secure insulation voltage resistance between conductor plugs.

The semiconductor device fabrication method according to the present embodiment shown in FIGS. 4A to 5A is the same as the semiconductor device fabrication method according to the first embodiment shown in FIGS. 1A to 2A, and its explanation is not repeated.

Next, a 20 nm-thickness silicon oxide film 26 is formed in the same way as in the first embodiment.

Figure 5A:
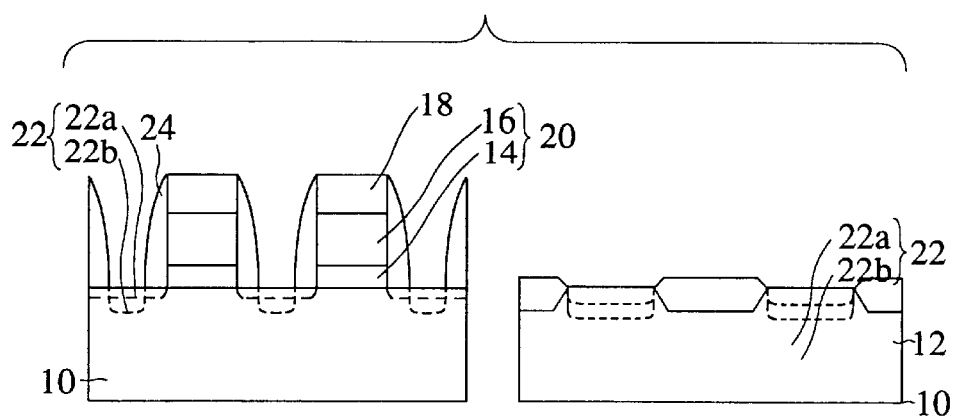
FIGS. 5A to 5C are sectional views (Part 2) of the semiconductor device in the steps of the semiconductor device fabrication method according to the second embodiment of the present invention.
Figure 5B:
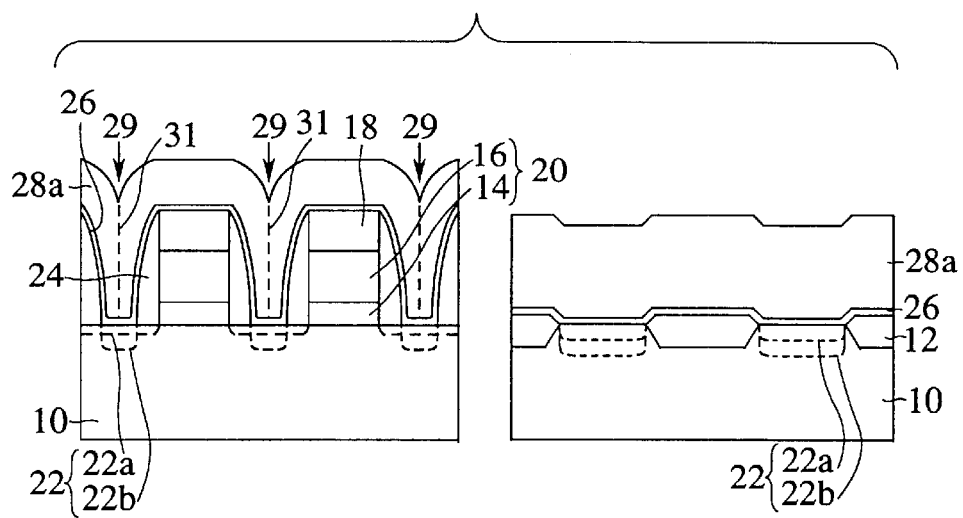
Figure 5C:
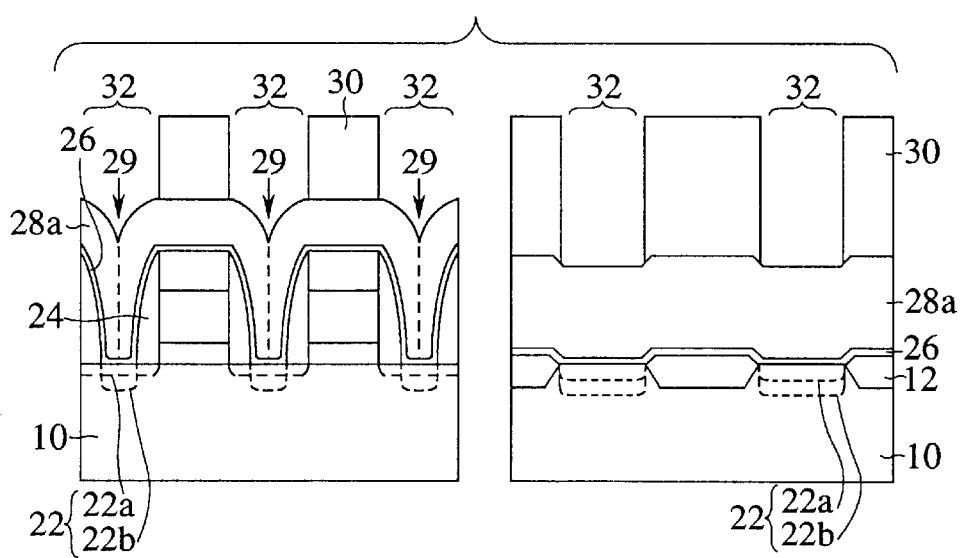

Then a stopper (second insulation) film 28$a$ is formed on the entire surface by thermal CVD (Chemical Vapor Deposition). It is preferable that a film thickness of the stopper film 28$a$ is suitably set so that the stopper film 28$a$ can define a wide gap 29, and can be, e.g., 100 nm–200 nm. The stopper film 28$a$, which is formed by thermal CVD, can go on being formed in a substantially uniform thickness on the silicon oxide film 26, and finally the surface of the stopper film 28$a$ defines no gap between the gate electrodes 20, forming a contact surface 31 (FIG. 5B).

Next, an inter-layer insulation film 30 of a 1 $\mu$m-thickness PSG film on the entire surface.

Then, anisotropic etching is performed with the stopper film 28$a$ as an etching stopper to form a contact hole 32 down to the upper surface of the stopper film 28$a$. An etching gas is, e.g., $C_4F_8/Ar/O_2/CO$ gas (see FIG. 5C).

Figure 6A:
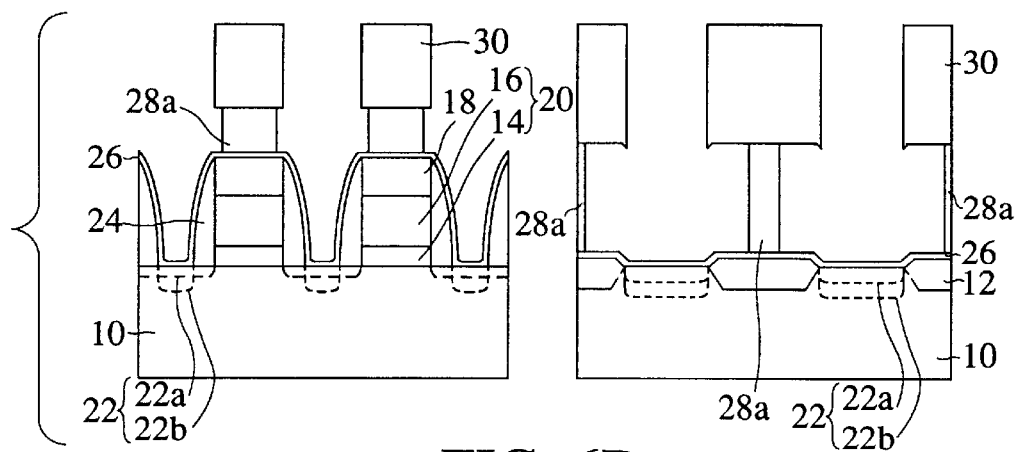
FIGS. 6A to 6C are sectional views (Part 3) of the semiconductor device in the steps of the semiconductor device fabrication method according to the second embodiment of the present invention.

Next, the stopper film 28$a$ is subjected to semi-anisotropic etching with the silicon oxide film 26 as an etching stopper. An etching gas is, e.g., $SF_6/HBr/N_2$ gas, $SF_6/O_2/N_2$ gas or others. The stopper film 28$a$ formed by thermal CVD has the contact surface 31, and the etching advances faster along the contact surface 31 to form a large undercut as shown on the right side of FIG. 6A (FIG. 6A).

Figure 6B:
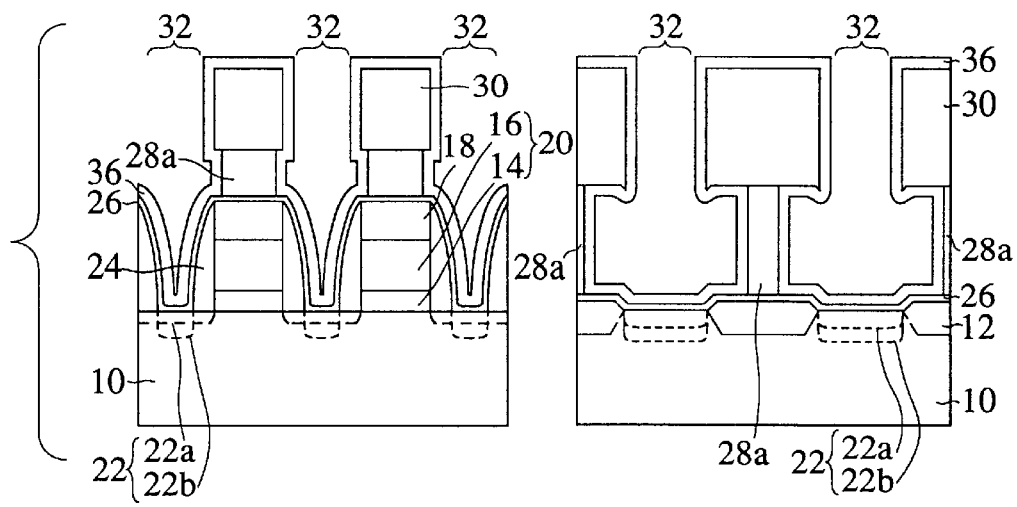
Figure 6C:
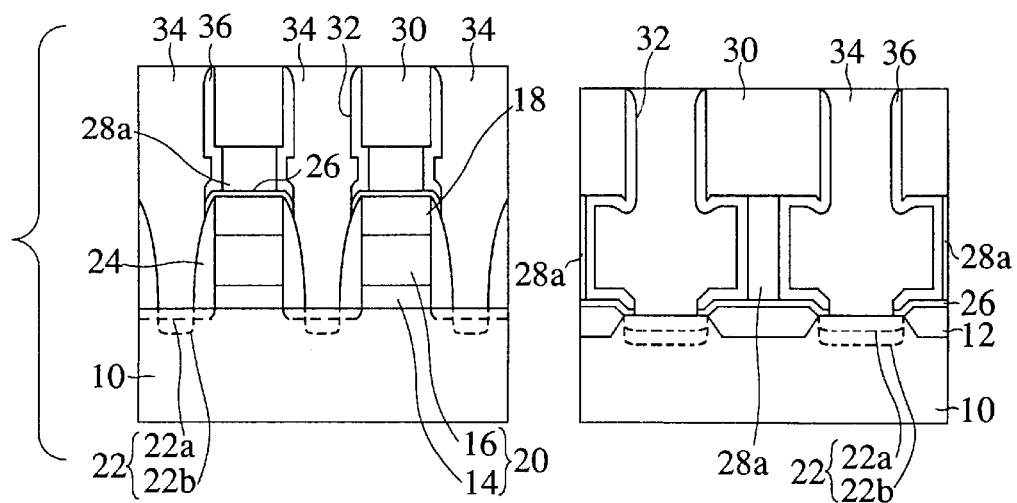
Figure 7A:
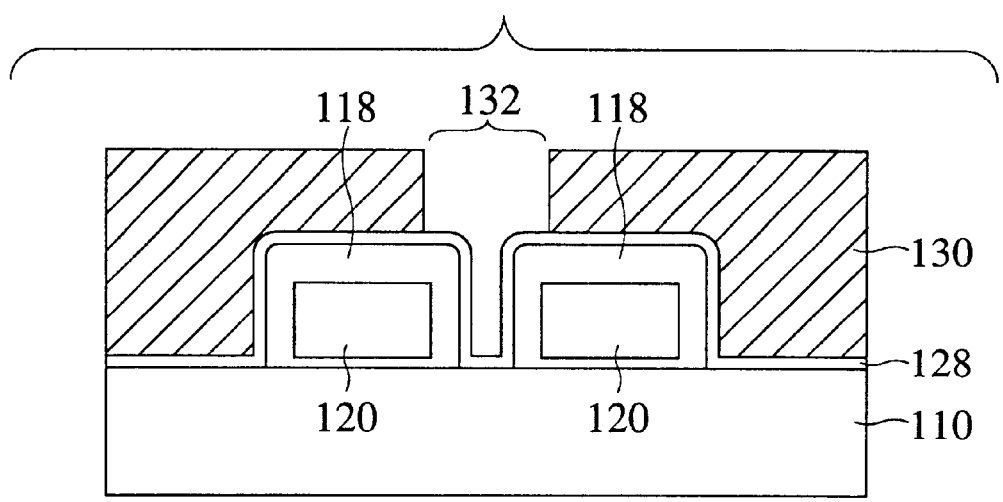
FIGS. 7A and 7B are sectional views of the conventional semiconductor device.
Figure 7B:
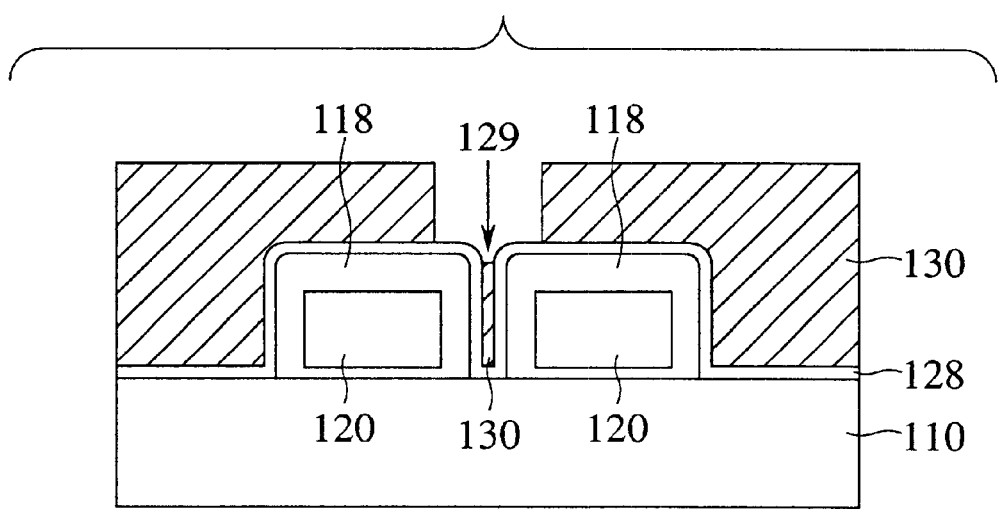

Then, an (fourth) insulation film 36 of a 50 nm-thickness silicon nitride film is formed by CVD (see FIG. 6B). In the present embodiment the stopper film 28a is largely undercut, but the insulation film 36 is formed in the contact hole 32, whereby an insulation voltage resistance between conductor plugs 34 can be high. The insulation film 36 can be, e.g., silicon oxide film or silicon nitride film ($SiN_4$ film), but silicon nitride film is more preferable in consideration of an HF-based pre-process performed in forming a conductor plug in a later step.

Subsequently, the silicon oxide film 26 and the stopper film 28a on the source/drain diffusion layer 22 are subjected to anisotropic etching to form a contact hole 32 arriving at the source/drain diffusion layer 22. An etching gas can be, e.g., $CHF_3/O_2$ gas. By using such etching gas a selection ratio of the insulation film 36 with respect to the silicon oxide film 26 is about 2.

Next, a polysilicon film is formed on the entire surface by CVD. Then, the polysilicon film is polished by CMP until the surface of the inter-layer insulation film 30 is exposed to thereby form a conductor plug 34 of the polysilicon film in the contact hole 32 (see FIG. 6C).

As described above, according to the present embodiment, because the stopper film is formed by thermal CVD, the stopper film defines a contact surface between the gate electrodes. Along the contact surface the etching advances faster to largely undercut the stopper film. However, the insulation film is formed in the contact hole, which allows an insulation voltage resistance between the conductor plugs adjacent to each other to be high. As a result, a micronized semiconductor device can be fabricated without lowering its reliability.

Modifications

The present invention is not limited to the above-described embodiments and cover other various modifications In the first and the second embodiments, the present invention is applied to DRAMs but may be applied to, e.g., any semiconductor device as long as it is fabricated by using SAC.

In the first and the second embodiments, the stopper film is silicon nitride film, but is not limited to silicon nitride film and may be, e.g., SiON film.

In the second embodiment, the contact hole 32 reaching the source/drain diffusion layer 22 is formed by forming the insulation film 36 and next etching the insulation film 36 and the silicon oxide film 26. However, it is possible that the contact hole 32 reaching the source/drain diffusion layer 22 is formed by forming the insulation film 36 after the silicon oxide film 26 has been etched, and then etching the insulation film 36. In this case, an etching gas for etching the silicon oxide film 26 can be, e.g., $CHF_3/CF_4/Ar$ gas or $CHF_3/O_2$ gas.

What is claimed is:

1. A semiconductor device fabrication method comprising the steps of:

forming on a substrate a plurality of lines on upper surfaces and side surfaces of which a first insulation film is formed on;

depositing a second insulation film on and/or above the substrate and said lines, filling gaps between one of said lines and its adjacent one to thereby form the second insulation film;

forming on the second insulation film a third insulation film having etching characteristics different from those of the second insulation film;

etching the third insulation film with the second insulation film as a stopper; and etching the second insulation film to form a contact hole which reaches the substrate.

2. A semiconductor device fabrication method according to claim 1, wherein in the step of forming the second insulation film, the second insulation film is formed by CVD, applying a bias to the substrate.

3. A semiconductor device fabrication method according to claim 1, wherein in the step of forming the second insulation film, the second insulation film is formed by sputtering.

4. A semiconductor device fabrication method comprising the steps of:

forming g on a substrate a plurality of lines on upper surfaces and side surfaces of which a first insulation film is formed;

forming a second insulation film on the substrate and said lines, filling gaps between one of said lines and its adjacent one;

forming on the second insulation film a third insulation film having etching characteristics different from those of the second insulation film;

etching the third insulation film with the second insulation film as a stopper, and further etching the second insulation film to form a contact hole which reaches the substrate; and forming a fourth insulation film in the contact hole.

5. A semiconductor device fabrication method according to claim 4, further comprising the step of etching the fourth insulation film on the substrate after the step of forming the fourth insulation film.

6. A semiconductor device fabrication method according to claim 5, further comprising:

the step of forming a fifth insulation film on the entire surface after the step of forming said lines and before the step of forming the second insulation film; and the step of etching the fifth insulation film on the substrate after the step of forming the contact hole and before the step of forming the fourth insulation film.

7. A semiconductor device fabrication method according to claim 5, further comprising the step of forming a fifth insulation film on the entire surface after the step of forming of said lines and before the step of forming the second insulation film; and in which in the step of etching the fourth insulation film, the fourth insulation film and the fifth insulation film on the substrate are etched.

8. A semiconductor device fabrication method according to claim 4, wherein the second insulation film is SiN film or SiON film.

9. A semiconductor device fabrication method according to claim 5, wherein the second insulation film is SiN film or SiON film.

10. A semiconductor device fabrication method according to claim 6, wherein the second insulation film is SiN film or SiON film.

11. A semiconductor device fabrication method according to claim 7, wherein the second insulation film is SiN film or SiON film.

* * * * *